United States Patent [19]
Wisskirchen et al.

[11] Patent Number: 6,093,900
[45] Date of Patent: Jul. 25, 2000

[54] ACTUATABLE SWITCH IN SEALED HOUSING

[75] Inventors: Klaus Wisskirchen; Hartmut Draeger; Klaus Lamm, all of Berlin, Germany

[73] Assignee: ITT Manufacturing Enterprises, Inc., Wilmington, Del.

[21] Appl. No.: 09/133,130

[22] Filed: Aug. 12, 1998

[51] Int. Cl.[7] .................................................. H01H 9/04
[52] U.S. Cl. ........................................ 200/302.2; 200/298
[58] Field of Search .............................. 200/5 R, 17 R, 200/52 R, 61.85, 505, 511, 512, 520, 293, 293.1, 295, 298, 302.1, 302.2, 302.3, 330, 331, 332.1, 332.2, 333, 334, 341

[56] References Cited

U.S. PATENT DOCUMENTS

| | | | |
|---|---|---|---|
| Re. 32,747 | 9/1988 | Ullmann et al. | 200/157 |
| 3,749,870 | 7/1973 | Oakes | 200/168 G |
| 3,894,207 | 7/1975 | Jelley | 200/157 |
| 4,520,247 | 5/1985 | Pancook et al. | 200/298 |
| 4,849,587 | 7/1989 | Bacon | 200/61.85 |
| 4,918,270 | 4/1990 | Orrico | 200/302.2 |
| 5,382,767 | 1/1995 | Takano et al. | 200/531 |
| 5,489,754 | 2/1996 | Dirmeyer et al. | 200/302.1 |

*Primary Examiner*—Michael Friedhofer
*Attorney, Agent, or Firm*—Thomas L. Peterson

[57] ABSTRACT

An electrical switch (26) is mounted in a rigid housing in the form of a control handle (10), where the housing has a soft flexible covering (32) with a portion (40) that can be depressed to operate the switch. The housing is in the form of a shell with first and second separately molded shell parts (14,16). The first shell part has a hole (24) in it that is aligned with the switch actuator, and the covering is overmolded onto the first shell, with the portion of the covering lying over the hole in the first shell being thickened at the middle (44) of the hole to indicate the area to be depressed and for more comfortable depression. A peripheral area of the first shell has an upstanding wall (62) with passages (66) therein, and the overmolded flexible covering has connection portions (72) that extend from the main covering portion (46) and through the passages to a peripheral covering portion (74), with the peripheral covering portion lying between the first and second shell parts to seal the gap (70) between them.

9 Claims, 2 Drawing Sheets

1

ACTUATABLE SWITCH IN SEALED HOUSING

BACKGROUND OF THE INVENTION

Control handles, such as are used in video games, include at least one switch which is activated as by the thumb of a hand that is grasping the handle. It is desirable that at least one part of the handle, such as the part that abuts the palm of the hand, have a soft feel comparable to that of leather, and that the area to be depressed to operate the switch be slightly raised to indicate that the switch is there and to provide a soft tactile feel thereat to make it comfortable to repeatedly operate the switch. A handle of the above type which could be constructed at low cost, would be of value.

SUMMARY OF THE INVENTION

In accordance with one embodiment of the present invention, an apparatus for holding an electrical switch is provided, which has a soft leather-like surface area for gripping and an actuation area that is noticeable and that provides a soft tactile feel during depression of that area for actuation of a switch, where the apparatus is of simple and low cost design. The apparatus is in the form of a handle housing of rigid plastic material that includes first and second shell parts that can be fastened together. A covering of soft flexible material lies against the outside of the first shell part. The first shell part has a cutout, with the switch having a depressible actuator aligned with the cutout, and the covering has an area lying over the cutout and against the actuator. The covering area has a middle that forms a convex bump in the covering to indicate an area to be depressed, with the periphery of the area being thinner so it can flex when the bump is depressed.

An edge region of the first housing has an upstanding wall with through passages therein. The covering is overmolded around the first shell part, with material flowing through the passages and merging into a peripheral cover area. The peripheral cover area lies between the first and second shells to seal the gap between them.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
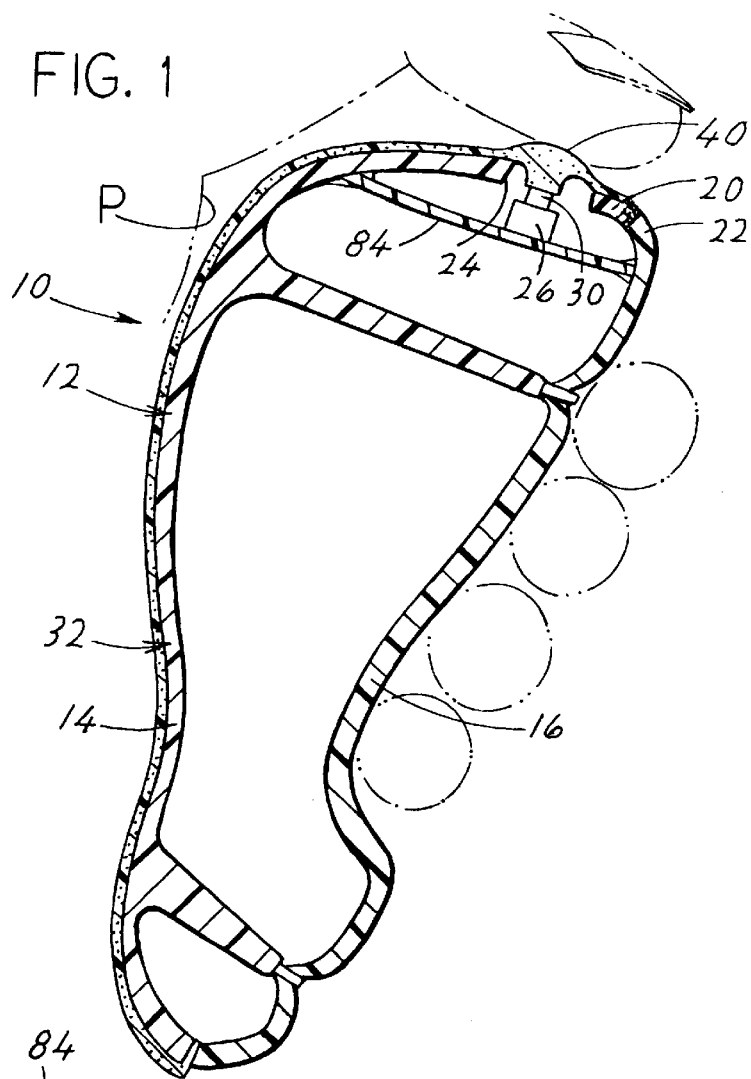
FIG. 1 is a sectional side view of a fully assembled handle of the present invention, with a person's hand being shown in phantom lines thereabout.

FIG. 1 illustrates a control apparatus 10 in the form of a handle that may be used, for example, as a video game control. The handle includes a housing 12 of rigid material, formed by first and second shells 14, 16 having adjacent edge portions 20, 22. The first shell 14 has a cutout 24 in the form of a hole. A switch 26 (electrical, optical, etc) has a depressible actuator 30 aligned, or in line, with the center of the hole. A covering 32 of soft flexible molded polymer material lies over most of the outside surface 34 of the first shell, to abut the palm P of a hand. The covering has a cutout-covering area 40 lying over the switch actuator 30 and covering the cutout 24. The cutout-covering area 40 is depressible to depress the switch actuator and operate the switch.

Figure 3:
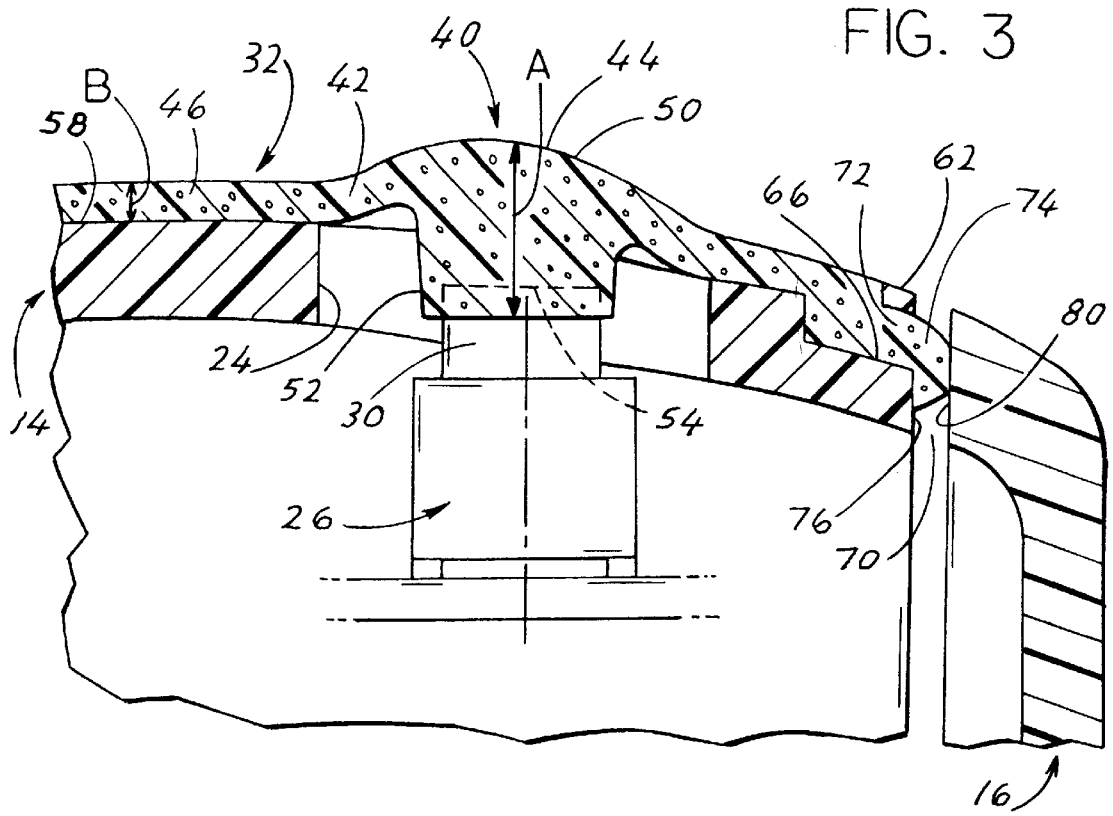
FIG. 3 is an enlarged sectional view of an area of the handle of FIG. 1.

As shown in FIG. 3, the cutout covering area 40 includes a transition or periphery part 42 that lies over a periphery of the hole, immediately inside the walls of the hole, and also has a middle part 44 that lies over a middle of the hole. The middle part 44 has a greater thickness A than the thickness B of the main part 46 of the covering. The thickened middle part 44 forms a protrusion or convex area or bump at 50 that makes it easy for a person to find the area to be depressed. The thickened middle part also has a depending portion 52 that extends downwardly into the hole 24 and that has a recess 54 that receives the top of the actuator 30. The increase thickness of the middle part 44 not only provides the bump to feel where the middle area is, but also avoids having the user's finger feel a hard spot formed by the middle actuator, because forces are distributed by the thickened middle part. The transition part 42 is thin, so it can readily bend up and down when the middle part and actuator are depressed.

The covering 32 of soft flexible material is preferably formed by overmolding the first shell part 14. That is, after the first shell part 14 is molded, as by injection molding, it is placed in another mold with a thin but wide cavity lying between the outside surface 58 of the first shell part and another wall of the cavity. A polymer that forms a soft flexible material (e.g. a foam) is flowed into the overmold to cover the outside surface of the first shell part and preferably to also bond thereto.

Figure 4:
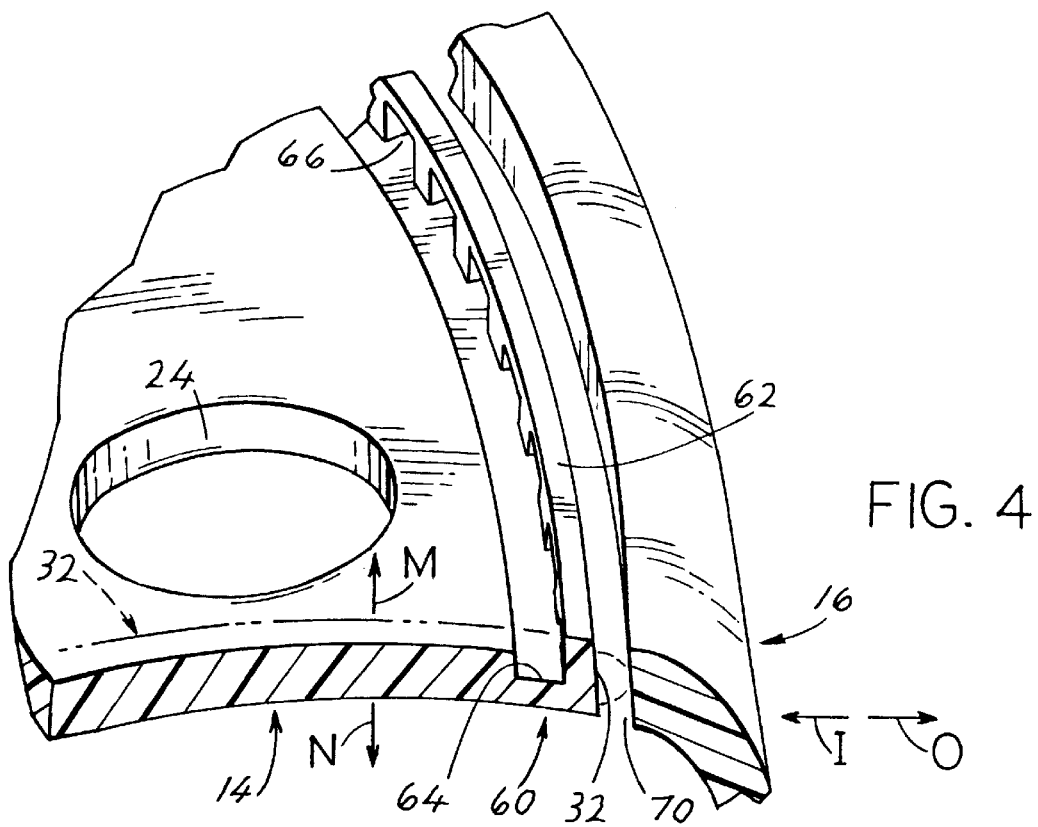
FIG. 4 is an enlarged isometric view of a portion of the handle of FIG. 3, but with the covering shown only in phantom lines.

As shown in FIG. 4, the first shell part 14 has an outer edge portion 60 with an upstanding wall 62 and with a groove 64 lying immediately inward of the upstanding wall 62. It should be noted that the terms "outward and inward" or "outer and inner" refer to directions O, I with respect to the outer edge portion 60 of the first shell part where it lies adjacent to the second shell part 16. The terms "outside and inside" refer to directions M, N relative to the hollow inside of the housing and the outside environment which lies around the housing.

The upstanding wall 62 at the outer edge portion 60 of the first shell part, has a plurality of passages 66 that extend outwardly through the upstanding wall. When the soft flexible covering 32 is overmolded over the first shell part, the covering material flows outwardly through the passages 66 and into a gap 70 that lies outward of the wall 62. As shown in FIG. 3, this results in connecting parts 72 in the covering that extend through the passages 66, and a peripheral covering portion in the form of a sealing lip 74 that lies on the outer edge 76 of the upstanding wall and at the extreme outer edge of the first shell part. When the second shell part 16 is fastened to the first shell part 14, the sealing lip 74 is compressed between an edge 80 of the second shell part and the edge 76 of the first shell part. This construction results in the presence of the sealing lip 74 and connection parts 72 that serve two purposes. A first purpose is to prevent the outer edge of the covering from pealing away from the rigid housing and becoming frayed. A second purpose is to provide a water resistant seal in the gap 70. Applicant prefers that the covering material not only have a soft feel and be flexible, but also be elastomeric to facilitate sealing by the sealing lip 74.

Figure 2:
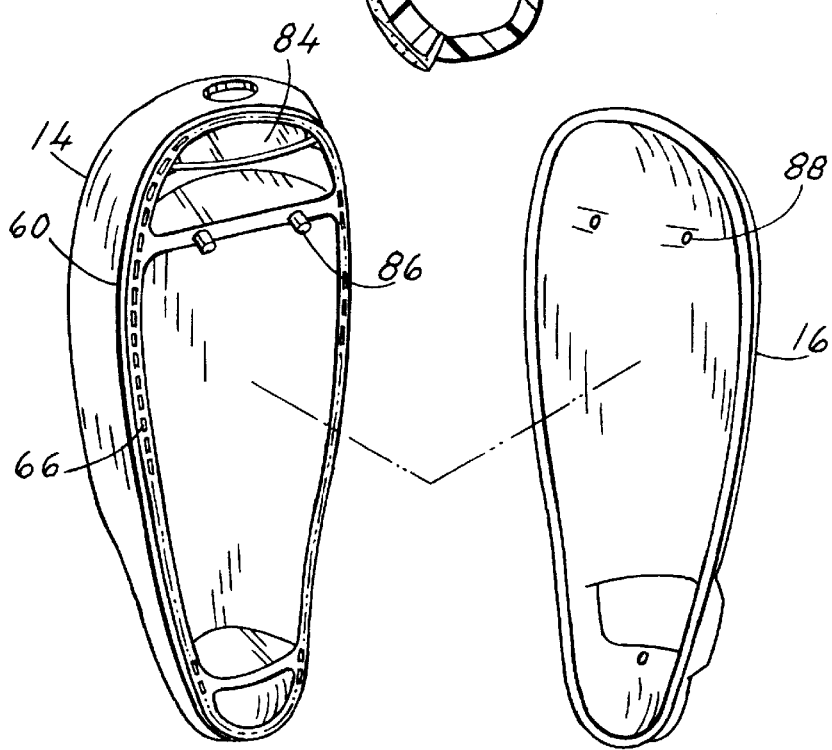
FIG. 2 is an exploded isometric view of the housing of the handle of FIG. 1.

FIG. 2 shows the first and second shell parts 14, 16. A support part 84 is installed in the first shell part to support the switch. Projections 86 are shown which are received in holes 88 of the second shell part to fasten the shell parts together. Instead of such projections, screws can be provided, which may extend through holes at the locations 88 and into threaded inserts molded into the first shell part at locations 86.

Although a switch is usually positioned so it is depressed by moving a finger, such as the thumb, at least partially downwardly, and the figures show such directions, it should be understood that the switch and housing can be positioned in any orientation with respect to the Earth. The handle can have a plurality of switches, each having an actuator lying below a different (or the same) hole covering area. The hole and switch actuator are usually on a top wall of the housing (a wall closer to the top than the bottom of the housing), but can be elsewhere.

Thus, the invention provides a control apparatus, usually in a shape of a control handle, which includes a switch (usually electrical but sometimes optical, pneumatic, etc.) with an actuator that can be depressed. The handle is in the form of a shell with first and second shell parts that enclose the hollow inside of the housing and that can be fastened together at their adjacent parallel outer edges. A first shell part has a cutout or hole, and a soft and flexible covering covers much of the first shell part and has a cutout-covering area lying over the hole. The cutout-covering area preferably has a thickened middle which indicates the location to be depressed, and which transmit forces to the switch actuator. An outer edge portion of the first housing includes an upstanding wall, which preferably extends upwardly from the bottom of a groove, and which has through passages. The covering has connection parts that extend through the passages, and the covering has a lip extending outside the passages. The lip not only holds down the outer edge of the covering but also can seal a gap between the two shell parts when the two shell parts are held together.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Control apparatus for holding at least one switch that has a downwardly-depressible actuator, comprising:

a rigid housing having a wall with at least one hole, said housing having a support part for holding said at least one switch with said actuator lying in line with said hole;

a largely sheet-like covering which lies on said housing, including on said wall thereof, said covering having a hole-covering area lying in line with said hole with said hole-covering area having a center lying over said actuator;

said covering being formed of a flexible material that has been over molded on said housing, and said center of said hole-covering area being downwardly depressible by deformation of part of said hole-covering area, to depress said actuator;

said housing includes first and second housing shell parts, said first shell part forming said wall, and said shell parts forming a gap between them;

said covering having a peripheral portion that is trapped between said shell parts.

2. The apparatus described in claim 1 wherein:

said first shell part has an outer edge portion that lies adjacent to said second shell part, with said outer edge portion having an upstanding wall with a plurality of through passages leading to said gap and with said covering having a main covering portion lying on a side of said upstanding wall that is opposite said gap and having a plurality of connecting parts that extend from said main covering part and through said passages and that merge with said peripheral portion.

3. Control apparatus comprising:

a handle housing comprising a rigid molded polymer shell comprising first and second shell parts, said shell having an outside surface;

a covering of soft flexible material which is overmolded onto said first shell part and which lies against at least a portion of the outside surface of said housing and is bonded thereto;

a switch mounted on said housing, said switch having a depressible actuator;

said shell having a cutout and said switch actuator lying in line with said cutout;

said covering having a cutout-covering area lying over said switch actuator and covering said cutout, with said cutout-covering area of said covering being depressible to depress said actuator;

said first shell part having a main shell portion, an edge region with an upstanding wall extending along said edge region, and a plurality of through passages in said upstanding wall;

said covering includes a main covering part that is overmolded on said main shell portion, a peripheral covering part lying on a side of said upstanding wall that is opposite said main covering part, and a plurality of covering connecting parts that extend through said passages and that merge with said main covering part and said peripheral covering part.

4. The apparatus described in claim 3 wherein:

said first and second shell parts have parallel edges with a gap between them;

said peripheral covering part includes a seal lip that lies in said gap and that is compressed between said edges of said first and second shell parts.

5. A method for forming a control apparatus, comprising:

molding first and second shell parts of a rigid polymer, so each shell part has an edge that can extend parallel to an edge of the other shell part, and fastening said shell parts together so said edges extend parallel to form a shell assembly, including forming said first shell with a cutout having a cutout middle and a cutout periphery;

installing a switch in said shell assembly, with said switch having an actuator aligned with said cutout;

overmolding said first shell with a covering of flexible covering material;

said step of molding said first shell part includes forming said first shell part with an edge region having an upstanding wall with a plurality of passages therein, and said step of overmolding includes flowing said cover material through said passages to form connectors and merging said connectors with covering material that lies on opposite sides of said passages.

6. Control apparatus for holding at least one switch that has a downwardly-depressible actuator, comprising:

a rigid housing for grasping by a hand, with said housing having an even first side against which the palm of the hand is pressed and an opposite second side against which the fingers other than the thumb is pressed, and a top against which the thumb can press, said top having a hole and said housing having a support part for holding said at least one switch with said actuator lying in line with said hole;

a largely sheet-like soft covering which also lies on said housing first side to provide an even cushioning surface for the palm and which also lies on said top, with said covering having a hole-covering area lying in line with said hole with said hole-covering area having a center lying over said actuator;

said covering being formed of a flexible material that has been overmolded on said housing, and said center of said hole-covering area being downwardly depressible by deformation of part of said hole-covering area, to depress said actuator.

7. The apparatus described in claim 6 wherein:

said covering covers said first side to cushion the palm of the hand, and said top to cushion the thumb of the hand, but said second side is devoid of said covering.

8. The apparatus described in claim 6 wherein:

said covering has a first thickness above an annular area at the periphery of said hole, and has a greater thickness at said center of said hole-covering area, with said center of said hole-covering area forming an upwardly projecting bump having a convex upper surface.

9. The apparatus described in claim 6 wherein:

said covering is of substantially non-elastomeric leather-like material.

* * * * *